Aug. 8, 1967 V. Y. DOO 3,335,038
METHODS OF PRODUCING SINGLE CRYSTALS ON POLYCRYSTALLINE SUBSTRATES AND DEVICES USING SAME
Filed March 30, 1964 2 Sheets-Sheet 1

INVENTOR
VEN Y. DOO

BY Everett A. Gartrell

ATTORNEY

Aug. 8, 1967 V. Y. DOO 3,335,038

METHODS OF PRODUCING SINGLE CRYSTALS ON POLYCRYSTALLINE SUBSTRATES AND DEVICES USING SAME

Filed March 30, 1964 2 Sheets-Sheet 2

United States Patent Office 3,335,038

Patented Aug. 8, 1967

3,335,038

METHODS OF PRODUCING SINGLE CRYSTALS ON POLYCRYSTALLINE SUBSTRATES AND DEVICES USING SAME

Ven Y. Doo, Poughkeepsie, N.Y., assignor to International Business Machines Corporation, New York, N.Y., a corporation of New York Filed Mar. 30, 1964, Ser. No. 355,600
9 Claims. (Cl. 148—175)

The present invention is directed to methods of producing a group of large thin homogeneous single crystals of a first material on a polycrystalline substrate of a second material, and to the devices which use such crystals. While the method of the present invention is useful for a number of applications, it has particular utility in connection with the fabrication of semiconductor devices. Accordingly, it will be described in that environment.

In the manufacture of semiconductor devices, various fabrication operations are carried out on semiconductor starting wafers. These may include epitaxial deposition, surface masking, selective etching, selective diffusion, surface oxidation and passivation, and the application of suitable terminals. The starting wafers are made by growing an elongated single-crystal ingot or rod, slicing it into a plurality of sections and then lapping and etching those sections to form a large number of starting wafers. The formation of the wafers is time consuming and costly, requires special equipment, and is wasteful of semiconductor material.

Efforts have been made to eliminate the conventional starting wafer and the various fabrication steps preparatory to their formation. To that end, various processes have been tried for the direct production of single crystals of semiconductor material in the form of substantially flat thin bodies on a suitable substrate of a material such as glass or graphite. These have usually involved the thermal decomposition or reduction of a compound containing the desired semiconductor material so as to deposit the latter on the substrate. Some of these procedures have required the use of activating material such as silver or aluminum to promote crystal growth or nucleation of the semiconductor material in subsequent heating steps. These prior procedures and the necessary apparatus for carrying them out have been more complex than is desired for many applications or have not been capable of growing single semiconductor crystals of sufficient size and quality to facilitate the convenient fabrication of semiconductor devices therefrom.

It is an object of the present invention, therefore, to provide a new and improved method for producing homogeneous single crystals of a first material on a polycrystalline substrate of a second material which avoids one or more of the disadvantages and limitations of prior such methods.

It is another object of the invention to provide a new and improved method for producing a group of large thin homogeneous single crystals of a first material as a thin film on a substrate of a polycrystalline second material in adherent relation with that substrate.

It is a further object of the present invention to provide a new and improved method for producing a group of large thin homogeneous single crystals of a semiconductor material as a thin film on a substrate of a polycrystalline ceramic in adherent relation to the latter, which crystals are sufficiently large for use in the fabrication of semiconductor devices.

It is a still further object of the invention to provide a new and improved method for producing a group of large thin homogeneous single crystals of silicon as a thin film on a substrate of a polycrystalline ceramic in adherent relation to the latter, those crystals being sufficiently large for use in the fabrication of one or more semiconductor devices.

It is yet another object of the invention to provide a new and improved intermediate product for use in the fabrication of a PN junction semiconductor device.

It is also an object of the present invention to provide a new and improved method of producing a plurality of spaced PN junction devices on a substrate.

It is an additional object of the invention to provide a new and improved thin-film type of semiconductor device.

It is another object of the invention to provide a new and improved plurality of thin-film semiconductor devices on a single ceramic substrate.

In accordance with the particular form of the invention, the method of producing a group of large thin crystals on a substrate comprises depositing a thin film of a crystalline first material on a substrate of polycrystalline second material, and completely melting that film at a first temperature just slightly above its melting point but below that of the substrate so that the crystalline structure of the first material is eradicated without the formation of globules thereon caused by surface tension. The method also includes reducing the temperature of the molten film to approximately 20–100° C. below the aforesaid first temperature and maintaining it thereat until solidification takes place, whereby a group of large thin homogeneous single crystals of the first material is established as a thin film on the substrate in adherent relation thereto. The method also includes cooling the aforesaid established film and substrate to ambient temperature.

Also in accordance with the invention, the method of producing a plurality of spaced PN junction devices on a substrate comprises epitaxially depositing a thin film of a crystalline semiconductor material on a substrate of polycrystalline ceramic material, and completely melting the film at a first temperature just slightly above its melting point but below that of the substrate so that the crystalline structure of the semiconductor material is eradicated without the formation of globules thereon caused by surface tension. The method further includes reducing the temperature of the molten film to approximately 20–100° C. below the first temperature and maintaining it thereat until solidification takes place, whereby a group of large thin homogeneous single crystals of the semiconductor material is established as a thin film on a substrate in adherent relation thereto. The method additionally includes cooling the established film and substrate to ambient temperature, and epitaxially depositing on the established film a second semiconductor film of the same conductivity type as the established film. The method further includes forming a plurality of spaced PN functions in the second film, and applying electrical connections to the semiconductor material on opposite sides of the aforesaid junctions.

Further in accordance with the present invention, an intermediate product in the fabrication of a semiconductor PN junction device comprises a polycrystalline ceramic substrate, and at least one thin homogeneous single crystal semiconductor film adherent thereto and having a length of about 3000 microns and a width of about 500 microns.

A semiconductor device in accordance with the particular form of the invention comprises a polycrystalline ceramic substrate, at least one thin homogeneous single crystal semiconductor film adherent thereto and having a length of about 300 microns and a width of about 500 microns, an epitaxial layer of semiconductor material of the same conductivity type as the film deposited thereon, a region of semiconductor material of the opposite conductivity type in the aforesaid film and forming a PN junction therewith, and electrical connections to the aforesaid layer and to the aforesaid region.

The foregoing and other objects, features and advantages of the invention will be apparent from the following more particular description of a preferred embodiment of the invention, as illustrated in the accompanying drawings.

Figure 1:
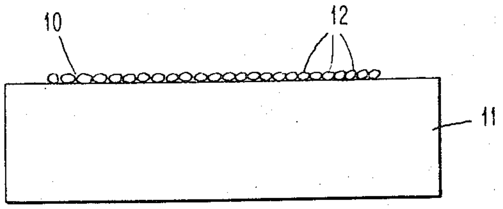
FIGS. 1 to 3 are elevational views representing a series of stages in the formation of thin homogeneous single crystals of a first material as a thin film on a substrate of a polycrystalline second material.

Referring now to FIG. 1 of the drawings, a thin film 10 of a polycrystalline first material is represented as being deposited on a substrate 11 of a polycrystalline second material. More particularly, the first material may be a suitable semiconductor material such as silicon while the second material may be a suitable ceramic or refractory material such as graphite, aluminum oxide, magnesium oxide, silicon carbide, zinc oxide or titanium dioxide or combinations thereof. Excellent results have been obtained when the ceramic substrate has been aluminum oxide. A silicon film 10 may be deposited on an aluminum oxide substrate by any of several well-known techniques such as the thermal reduction at an elevated temperature of trichlorosilane ($SiHCl_3$) or silicon tetrachloride ($SiCl_4$) with a hydrogen gas, the pyrolytic decomposition of a silane ($SiH_4$) or a halide such as silicon tetraiodide ($SiI_4$), or a disproportionating reaction of a silicon dihalide. Such operations are well known in the semiconductor art so that they do not need explanation. Reference is made, for example, to the article by J. Sigler and S.B. Watelski entitled "Epitaxial Techniques in Semiconductor Devices," appearing at pages 33 to 37 in the March 1961 issue of the Solid State Journal. However, a process which is in common use will be mentioned briefly. A mixture of trichlorosilane vapor, mixed with hydrogen as the carrier gas, is swept over the surface of the substrate 11 maintained at a high temperature in a reaction chamber (not shown). The vapor decomposes, leaving a deposit of silicon atoms 12, 12, which are sufficiently mobile at the temperature involved to find equilibrium lattice positions on the polycrystalline substrate 11. These atoms collectively form the film 10. If desired, by a judicious incorporation of the vapor of the proper impurity compound, the epitaxially deposited or grown film can be doped to the desired level in a manner also well known in the art. For example, gaseous boron trichloride may be employed if a P-type semiconductor film is desired, or gaseous phosphorous trichloride may be introduced into the reaction chamber along with the trichlorosilane vapor and the carrier gas if an N-type film is sought. For the present explanation, however, it will be assumed that no conductivity-determining impurity or doping material in the gaseous state is introduced into the reactor. Since the substrate 11 is a polycrystalline material, the silicon film 10 will also be polycrystalline and will have a grain size substantially the same as that of the substrate. The described epitaxial deposition operation is conducted for a period to deposit a film of a suitable thickness such as one having a thickness in the range of 10–20 microns, particularly good results being achieved with 12–15 micron films on aluminum oxide substrates having a grain size of about 1 micron in diameter. The extremely small grain size and the polycrystalline nature of the semiconductor material together with the random crystal orientation make such a film in that form unsuitable for use in a semiconductor device.

Figure 2:
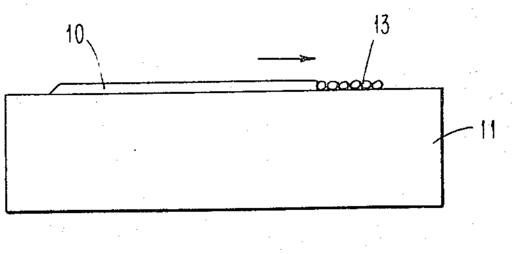

The next step in the production of a group of large thin crystals on the substrate 11 comprises completely melting the film 10 at a temperature just slightly above the melting point of the film but below that of the substrate so that the crystalline structure of the semiconductor material is eradicated without the formation of globules thereon caused by surface tension. This operation is carried out with the unit including the substrate 11 and its intimately attached film 10 in a conventional furnace (not shown) that may be heated in a suitable manner such as by radio-frequency or resistive heating to bring the temperature of the unit to just slightly above the melting point of the film. The substrate is supported in the furnace on a graphite block when radio-frequency heating is employed. This heating operation may be carried out so as to melt the film progressively from one edge to another such as from the left to the right as represented by the arrow in FIG. 2. The molten film may be at a temperature such as in the range of 5–30° C. above the melting point of that film, 5–15° C. above the melting point of 1410° C. of silicon being a range which has been employed with considerable success when the film 10 was silicon. The heating is conducted at a temperature in the range such that the thin crystalline layer is completely melted so as to form a continuous sheet of liquid or liquid film 10' as represented in FIG. 2. To that end, the temperature, while being just slightly above the melting point of the semiconductor, should be high enough that no trace of the original crystalline shape and orientation of the semiconductor remains and yet it should be sufficiently low to prevent small globules of the molten semiconductor from forming because of surface tension forces. It has been found that the actual temperature of the liquid film 10' will vary with the material being employed, surface tension forces which develop, and the viscosity and the wetting ability of the liquid film on the substrate. By completely melting the crystalline layer 10 of FIG. 1, it is meant that the individual crystals are melted completely rather than a melting of just the outer surfaces thereof. It has been found to be expedient in the melting operation to leave near one edge of the substrate an unmelted crystalline semiconductor region or barrier 13 which prevents the molten liquid from running off the other end of the substrate.

Figure 3:
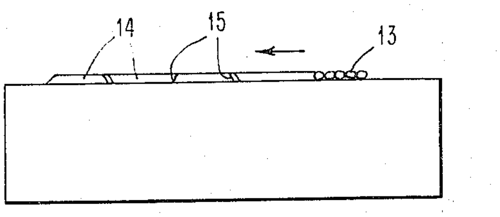
Figure 4:
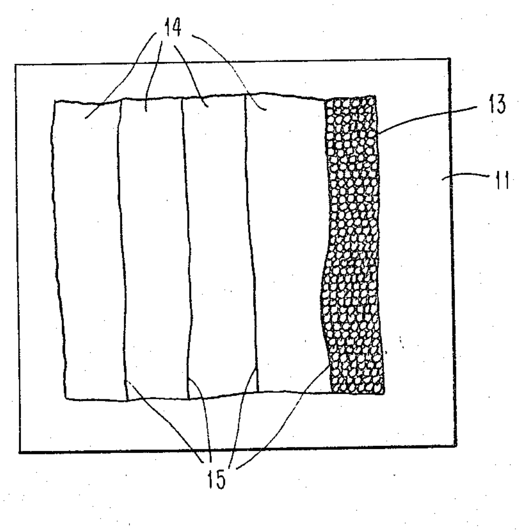
FIG. 4 is a top plan view of the structure represented in FIG. 3.

The next step in the crystal growing operation comprises reducing the temperature of the molten film 10' to approximately 20–100° C. below the melting temperature explained above, and maintaining that reduced temperature thereat until solidification of the film takes place, whereby a group of large thin homogeneous single crystals 14, 14 (see FIGS. 3 and 4) of the first or semiconductor material is established as a thin film on the substrate 10 in adherent relation thereto. This cooling operation may be accomplished in a period of from about 10–15 seconds by a sharp reduction of the heating current supplied to the melting furnace. A narrower range of from 30–50° C. below the melting temperature mentioned above has proved to be useful with silicon, particularly when the cooling is accomplished progressively from the other or right hand edge of the film to the one or left hand edge as denoted by the arrow in FIG. 3. The described cooling operation produces the growth of homogeneous single crystals 14, 14, each having a length of about 3000 microns, a width of about 500 microns and a thickness in the range of 10–20 microns. This initial cooling operation is performed rather slowly so that the number of nuclei is minimized and the growth of a small number of large single crystals or grains is promoted. When it has been observed that solidification of the semiconductor material has taken place, the rate of cooling of the established film and substrate can be increased until ambient temperature is reached, whereupon the operation of growing large single crystals on the polycrystalline substrate 11 is completed. This final cooling step may be accomplished in from about 15–20 minutes. The lines 15, 15 appearing in FIG. 4 represent the grain boundaries between the various single crystals 14, 14.

When an aluminum oxide substrate has been employed and a silicon film has been epitaxially deposited thereon without the use of conductivity-directing impurity vapor in the epitaxial deposition operation, it has been found that the single silicon crystals were of the P-type. Apparently P-type impurities present at the interface of the film and the aluminum oxide substrate are picked up by the molten silicon film to give the latter a P-type conductivity. When the aluminum oxide substrate was a commercially available 96% purity member, the P-type single crystals had a resistivity of about 0.0005–0.009 ohm-cm., and when the purity was about 99%, the corresponding resistivity was from 0.05–0.10 ohm-cm. Thus it will be seen that the higher resistivity semiconductor material is formed on the purer substrate. Despite the fact that the aluminum oxide substrate has a thermal coefficient of linear expansion which is about two to two and one half times that of the silicon film, the latter has been found to be firmly bonded to the substrate after the processing steps described above. The structure represented in FIGS. 3 and 4 comprises an intermediate product which may be employed in the fabrication of a semiconductor device or devices in the manner to be explained hereinafter.

The single crystal semiconductor films 14, 14 thus produced on the substrate 11 are ordinarily too thin and too low in resistivity for use in fabricating a semiconductor device directly therefrom. Accordingly, it is expedient to build up the thickness of these single crystals by epitaxial depositing thereon an additional film 16 of semiconductor material. See FIG. 5 of the drawings. This film ordinarily is of the same material as that of the single crystals 14, 14 and its orientation will be the same as that of the semiconductor material therebeneath. Accordingly, the epitaxial deposit builds up the thickness of the single crystals 14, 14 and the thickness of the polycrystalline barrier 13. If desired, a suitable conductivity-directing impurity may be introduced in the epitaxial deposition operation to control the impurity concentration of the deposited film 16. For the present consideration, however, it will be assumed that an impurity vapor is not intentionally present during the vapor deposition operation described above, and that the deposited film has a representative thickness of about 5–8 microns. Any suitable thickness film may be deposited, however. It has been found that the epitaxial film 16 remains P-type and its surface resistivity on the 96% pure aluminum ovide substrate 11 was about 0.03–0.07 ohm-cm. while that on a 99% pure aluminum oxide substrate was about 0.5–1.0 ohm-cm. Again the P-type impurities were apparently derived from the supporting substrate 11, and the higher resistivity film appeared on the purer aluminum oxide substrate. The film 16 has a higher resistivity than the single crystals 14, 14. This is because the epitaxial deposition takes place at a temperature which is lower than the melting point of the semiconductor material, being from 200–300° C. lower for silicon. At this lower temperature, the film 16 acquires fewer contaminants than would a molten film. Hence its resistivity is greater than that of the melt-grown crystals 14, 14.

Figure 5:
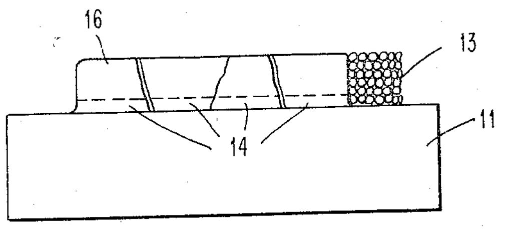
FIGS. 5 to 8 are elevational views representing successive stages in the fabrication of a plurality of thin film semiconductor devices from the unit shown in FIGS. 3 and 4.
Figure 6:
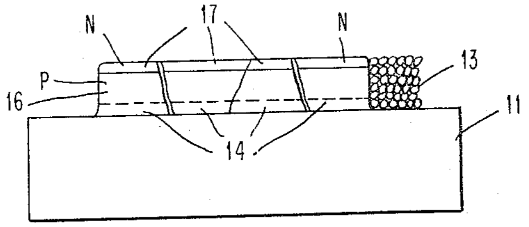
Figure 7:
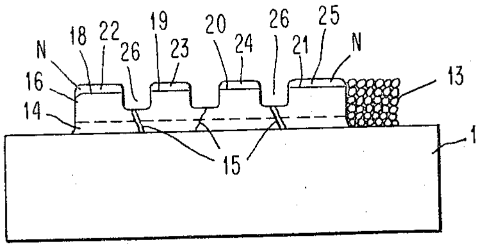
Figure 8:
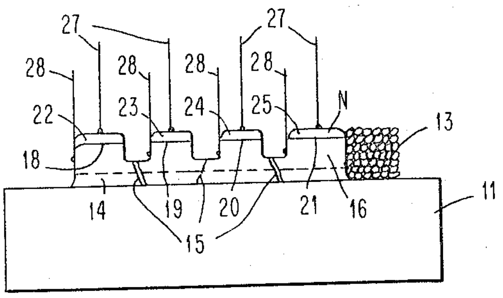

To produce a semiconductor device or devices from the structure of FIG. 5, it is necessary to establish one or more PN junctions therein. This may be accomplished conveniently by a conventional diffusion operation wherein an N-type impurity such as phosphor is diffused into the P-type film 16 to form an N-type semiconductor region 17 as represented in FIG. 6. Thereafter a conventional selective etching operation may be performed on the semiconductor material to remove predetermined portions of the N-type semiconductor region 17 and the P-type material thereunder to form a plurality of spaced PN junctions 18, 19, 20 and 21 and N-type regions 22 23, 24 and 25 as represented in FIG. 7. Briefly, this may be accomplished by applying an apertured etch-resistant mask (not shown) to the surface of the region 17 of FIG. 6 and subjecting the unit to an etching bath comprising a well-known solution of hydrofluoric acid, acetic acid and nitric acid which attacks the portions of the region 17 exposed by the apertures in the mask and etches a series of moats 26, 26 in the exposed semiconductor material (see FIG. 7) and leaves a series of mesas. Thereafter the etch-resistant mask is removed in a conventional manner leaving the structure represented in FIG. 7 which comprises four PN junction devices or semiconductor diodes separated by the various grain boundaries 15, 15. Semiconductor diodes having means with dimensions of about 375 x 250 microns have been constructed in this manner.

In a succeeding operation, electrical connections 27, 27 and 28, 28 are applied in a conventional manner to the semiconductor material on opposite sides of the PN junctions 18, 19, 20 and 21 to complete the semiconductor devices. Semiconductor diodes constructed in this manner on 96% purity aluminum oxide substrates have breakdown voltages ranging from 6–8 volts and low leakage currents of the order of $10^{-8}$ amperes. The breakdown voltages of diodes made from epitaxial films grown on 99% purity aluminum oxide substrates were in the range of 100–150 volts.

While the invention has been described in connection with the fabrication of semiconductor diodes, it will be manifest to those skilled in the art that transistors or combinations of transistors and diodes may be made using the techniques of the present invention.

While the invention has been shown and described with reference to a preferred embodiment thereof, it will be understood by those skilled in the art that various changes in form and details may be made therein without departing from the spirit and scope of the invention.

What is claimed is:

1. The method of producing a group of large thin crystals on a substrate comprising:

vapor-depositing a thin film of a crystalline first material in the order of microns in thickness on a substrate of polycrystalline second material;

completely melting said film at a first temperature just slightly above its melting point but below that of said substrate so that the crystalline structure of said first material is eradicated without the formation of globules thereon caused by surface tension;

reducing the temperature of said molten film to approximately 20–100° C. below said first temperature and maintaining it thereat until solidification takes place, whereby a group of large thin homogeneous single crystals of said first material is established as a thin film on said substrate in adherent relation thereto without the use of a seed crystal; and cooling said established film and substrate to ambient temperature.

2. The method of producing a group of large thin crystals on a substrate comprising:

vapor-depositing a thin film of a crystalline first material in the order of microns in the thickness on a substrate of polycrystalline second material;

completely melting said film at a first temperature in the range of 5–30° C. above its melting point but below that of said substrate so that the crystalline structure of said first material is eradicated without the formation of globules thereon caused by surface tension;

reducing the temperature of said molten film to approximately 20–100° C. below said first temperature and maintaining it thereat until solidification takes place, whereby a group of large thin homogeneous single crystals of said first material is regrown as a thin film on said substrate in adherent relation thereto without the use of a seed crystal; and cooling said established film and substrate to ambient temperature.

3. The method of producing a group of large thin crystals on a substrate comprising:

vapor-depositing a thin film of a crystalline first material in the order of microns in thickness on a substrate of polycrystalline second material;

completely melting said film at a first temperature in the range of 5–15° C. above its melting point but below that of said substrate so that the crystalline structure of said first material is eradicated without the formation of globules thereon caused by surface tension;

reducing the temperature of said molten film in 10–15 seconds to approximately 30–50° C. below said first temperature and maintaining it thereat until solidification takes place, whereby a group of large thin homogeneous single crystals of said first material is established as a thin film on said substrate in adherent relation thereto without the use of a seed crystal; and cooling said established film and substrate to ambient temperature in about 15–20 minutes.

4. The method of producing a group of large thin crystals on a substrate comprising:

vapor-depositing a thin film of a crystalline semiconductor material in the order of microns in thickness on a substrate of polycrystalline second material;

completely melting said film progressing from one edge toward its opposite edge at a first temperature just slightly above its melting point but below that of said substrate so that the crystalline structure of said semiconductor material is eradicated without the formation of globules thereon caused by surface tension;

reducing the temperature of said molten film progressing from said opposite edge toward said one edge to approximately 20–100° C. below said first temperature and maintaining it thereat until solidification takes place, whereby a group of large thin homogeneous single crystals of said semiconductor material is established as a thin film on said substrate in adherent relation thereto without the use of a seed crystal; and cooling said established film and substrate to ambient temperature.

5. The method of producing a group of large thin crystals on a substrate comprising:

vapor-depositing a thin film of a crystalline semiconductor material having a thickness in the range of 10–20 microns on a substrate of polycrystalline aluminum oxide;

completely melting said film progressively from one edge toward its opposite edge at a first temperature in the range of 5–30° C. above its melting point but below that of said substrate so that the crystalline structure of said semiconductor material is eradicated without the formation of globules thereon caused by surface tension;

reducing the temperature of said molten film in 10–15 seconds progressively from said opposite edge toward said one edge to approximately 20–100° C. below said first temperature and maintaining it thereat until solidification takes place, whereby a group of large thin homogeneous single crystals of P-type semiconductor material is established as a thin film on said substrate in adherent relation thereto without the use of a seed crystal; and cooling said established film and substrate in 15–20 minutes to ambient temperature.

6. The method of producing a group of large thin crystals on a substrate comprising:

vapor-depositing a thin film of a crystalline semiconductor material having a thickness of about 10 microns on a substrate of polycrystalline second material;

completely melting said film at a first temperature just slightly above its melting point but below that of said substrate so that the crystalline structure of said semiconductor material is eradicated without the formation of globules thereon caused by surface tension;

reducing the temperature of said molten film to approximately 20–100° C. below said first temperature and maintaining it thereat until solidification takes place, whereby a group of large thin homogeneous single crystals of said semiconductor material is established as a thin film on said substrate in adherent relation thereto without the use of a seed crystal;

cooling said established film and substrate to ambient temperature; and epitaxially depositing on said established film a second semiconductor film of the desired conductivity type and having a thickness of at least 5 microns.

7. The method of producing a plurality of spaced PN junction devices on a substrate comprising:

vapor-depositing a thin film of a crystalline semiconductor material in the order of microns in thickness on a substrate of polycrystalline ceramic material;

completely melting said film at a first temperature just slightly above its melting point but below that of said substrate so that the crystalline structure of said semiconductor material is eradicated without the formation of globules thereon caused by surface tension;

reducing the temperature of said molten film to approximately 20–100° C. below said first temperature and maintaining it thereat until solidification takes place, whereby a group of large thin homogeneous single crystals of said semiconductor material is established as a thin film on said substrate in adherent relation thereto without the use of a seed crystal;

cooling said established film and substrate to ambient temperature;

epitaxially depositing on said established film a second semiconductor film of the same conductivity type as said established film;

forming a plurality of spaced PN junctions in said second film; and applying electrical connections to the semiconductor material on opposite sides of said junctions.

8. The method of producing a plurality of spaced PN junction devices on a substrate comprising:

vapor-depositing a thin film of a crystalline semiconductor material in the order of microns in thickness on a substrate of polycrystalline ceramic material;

completely melting said film at a first temperature just slightly beyond its melting point but below that of said substrate so that the crystalline structure of said semiconductor material is eradicated without the formation of globules thereon caused by surface tension;

reducing the temperature of said molten film to approximately 20–100° C. below said first temperature and maintaining it thereat until solidification takes place, whereby a group of large thin homogeneous single crystals of said semiconductor material is established as a thin film on said substrate in adherent relation thereto without the use of a seed crystal;

cooling said established film and substrate to ambient temperature;

epitaxially depositing on said established film a second semiconductor film of the same conductivity type and said established film and having a thickness of at least 5 microns;

diffusing a conductivity-directing impurity into said second film to form a semiconductor region of the opposite conductivity type and PN junctions between said second film and said region;

removing predetermined portions of said second film and said region to form a plurality of spaced PN junctions; and applying electrical connections to the semiconductor material on opposite sides of said junctions.

9. The method of producing a plurality of spaced PN junction devices on a substrate comprising:
- vapor-depositing a thin film of a crystalline semiconductor material having a thickness in the range of 10–20 microns on a substrate of polycrystalline aluminum oxide;
- completely melting said film progressively from one edge toward its opposite edge at a first temperature in the range of 5–30° C. above its melting point but below that of said substrate so that the crystalline structure of said semiconductor material is eradicated without the formation of globules thereon caused by surface tension;
- reducing the temperature of said molten film in 10–15 seconds progressively from said opposite edge toward said one edge to approximately 20–100° C. below said first temperature and maintaining it thereat until solidification takes place, whereby a group of large thin homogeneous single crystals of P-type semiconductor material is established as a thin film on said substrate in adherent relation thereto without the use of a seed crystal;
- cooling said established film and substrate to ambient temperature in about 15–20 minutes;
- epitaxially depositing on said established film a second semiconductor film of the same conductivity type as said established film and having a thickness of at least 5 microns;

- forming a semiconductor region of the N conductivity type on said second semiconductor film and a PN junction therebetween;
- etching away predetermined portions of said second film and said region to form a plurality of spaced PN junctions; and
- applying electrical connections to the semiconductor material on opposite sides of said junctions.

References Cited

UNITED STATES PATENTS

| | | | |
|---|---|---|---|
| 2,813,048 | 1/1957 | Pfann | 148—1.6 |
| 2,992,903 | 7/1961 | Imber | 148—1.6 |
| 3,139,361 | 6/1964 | Rasmanis | 148—175 |
| 3,160,522 | 12/1964 | Heywang et al. | 148—1.6 |
| 3,233,904 | 12/1965 | Warner et al. | 148—175 |

OTHER REFERENCES

Van Ligten: IBM Technical Disclosure Bulletin, vol. 4, No. 10, March 1962, pp. 58–59.

DAVID L. RECK, *Primary Examiner.*

N. F. MARKVA, *Assistant Examiner.*